US008742600B2

(12) United States Patent
Chang et al.

(10) Patent No.: US 8,742,600 B2
(45) Date of Patent: Jun. 3, 2014

(54) DUAL-PHASE INTERMETALLIC INTERCONNECTION STRUCTURE AND METHOD OF FABRICATING THE SAME

(71) Applicant: Industrial Technology Research Institute, Hsinchu (TW)

(72) Inventors: Jing-Yao Chang, New Taipei (TW); Tao-Chih Chang, Taoyuan County (TW); Tung-Han Chuang, Taipei (TW); Chun-Yen Lee, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/736,088

(22) Filed: Jan. 8, 2013

(65) Prior Publication Data
US 2014/0097534 A1 Apr. 10, 2014

(30) Foreign Application Priority Data

Oct. 8, 2012 (TW) ............................. 101137147 A

(51) Int. Cl.
*H01L 23/48* (2006.01)
*H01L 23/52* (2006.01)
*H01L 29/40* (2006.01)

(52) U.S. Cl.
USPC ............ 257/782; 257/779; 257/783; 438/118

(58) Field of Classification Search
USPC ......... 257/748, 750, 782, 783, 779, 780, 781; 438/118, 615, 632, 644, 652, 654
See application file for complete search history.

(56) References Cited

U.S. PATENT DOCUMENTS

| 7,598,603 | B2 | 10/2009 | Otremba |
| 8,012,865 | B2 | 9/2011 | Mehrotra |
| 8,157,158 | B2 | 4/2012 | Gruber et al. |
| 2007/0089811 | A1* | 4/2007 | Ikeda et al. ................... 148/536 |
| 2007/0200219 | A1 | 8/2007 | Otremba |
| 2008/0006923 | A1 | 1/2008 | Otremba |
| 2009/0057897 | A1 | 3/2009 | Patwardhan et al. |
| 2011/0084387 | A1 | 4/2011 | Dubin et al. |
| 2012/0044652 | A1* | 2/2012 | Horikawa et al. ............. 361/728 |

(Continued)

FOREIGN PATENT DOCUMENTS

| TW | I347643 | 8/2011 |
| TW | I360452 | 3/2012 |

OTHER PUBLICATIONS

Bader et al., "Rapid Formation of Intermetallic Compounds by Interdiffusion in the Cu—Sn and Ni—Sn Systems," Acta metall, mater. 43(1), Jan. 1995, pp. 329-337.

(Continued)

*Primary Examiner* — Sheila V. Clark
(74) *Attorney, Agent, or Firm* — Jianq Chyun IP Office

(57) ABSTRACT

Provided are a dual-phase intermetallic interconnection structure and a fabricating method thereof. The dual-phase intermetallic interconnection structure includes a first intermetallic compound, a second intermetallic compound, a first solder layer, and a second solder layer. The second intermetallic compound covers and surrounds the first intermetallic compound. The first intermetallic compound and the second intermetallic compound contain different high-melting point metal. The first solder layer and the second solder layer are disposed at the opposite sides of the second intermetallic compound, respectively. The first intermetallic compound is adapted to fill the micropore defects generated during the formation of the second intermetallic compound.

17 Claims, 4 Drawing Sheets

(56) References Cited

U.S. PATENT DOCUMENTS

| | | | |
|---|---|---|---|
| 2012/0256228 A1* | 10/2012 | Lin et al. | 257/99 |
| 2013/0140685 A1* | 6/2013 | Heinrich et al. | 257/666 |
| 2013/0241069 A1* | 9/2013 | Nakamura et al. | 257/762 |
| 2013/0313704 A1* | 11/2013 | Souriau | 257/737 |

OTHER PUBLICATIONS

Chuang et al., "Elimination of voids in reactions between Ni and Sn: A novel effect of silver," Scripta Materialia 66 (3-4), Feb. 2012, pp. 171-174.

Görlich et al., "Reaction kinetics of Ni/Sn soldering reaction," Acta Materialia 58(9), May 2010, pp. 3187-3197.

Bosco et al., "Critical interlayer thickness for transient liquid phase bonding in the Cu—Sn system," Acta Materialia 52(10), Jun. 2004, pp. 2965-2972.

Chang et al., "Reliable Microjoints Formed by Solid-Liquid Interdiffusion (SLID) Bonding Within a Chip-Stacking Architecture," IEEE Transactions on Components, Packaging and Manufacturing Technology 2 (6), Jun. 2012, pp. 979-984.

\* cited by examiner

DUAL-PHASE INTERMETALLIC INTERCONNECTION STRUCTURE AND METHOD OF FABRICATING THE SAME

CROSS-REFERENCE TO RELATED APPLICATION

This application claims the priority benefit of Taiwan application serial no. 101137147, filed on Oct. 8, 2012. The entirety of the above-mentioned patent application is hereby incorporated by reference herein and made a part of this specification.

TECHNICAL FIELD

The disclosure relates to a dual-phase intermetallic interconnection structure and a method of fabricating the same.

BACKGROUND

Silicon carbide devices increase the energy conversion efficiency of power modules; however, the encapsulation process thereof faces unique technical problems. Firstly, the junction temperature Tj of the wafer of current silicon-based power modules is around 150° C., which is still within the acceptable temperature range of common lead-free solder material (Sn3.0Ag0.5Cu). However, when silicon carbide devices are introduced, the junction temperature increases to above 175° C. even for power control module or solar micro inverter of medium to low wattage. The melting temperature of Sn3.0Ag0.5Cn is only 217° C. Therefore, under such temperature conditions, serious creep effect will take place, which is disadvantageous for the mechanical strength of the junction point, causing the junction point unable to satisfy the need for long-term reliability, not to mention products such as electrical modules used in automobiles in applications where the junction temperature reaches 250° C. Therefore, as far as silicon carbide power modules are concerned, high temperature lead-free solders will be one of the key factors in deciding product quality and lifespan.

Currently, the main high temperature lead-free soldering technique includes using zinc-based high temperature lead-free solders, nano-metal powder sintering, and solid-liquid inter-diffusion (SLID).

Different from general reflow or thermocompressive bonding, the working principle of solid-liquid inter-diffusion is to allow low melting temperature solder material to completely react with solid-state high melting temperature metals to form a stable high melting temperature intermetallic compound. This kind of intermetallic compound has a melting temperature of over 300° C.; therefore, it allows the joint to maintain good mechanical strength under high temperature environments, which improves long-term reliability of the module.

However, in application of solid-liquid inter-diffusion, a plurality of technical difficulties involving fabrication and material diffusion arises. For fabrication, problems include junction temperature exceeding 260° C. and fabricating time lasting longer than 10 minutes. These problems can be overcome by solder material and thickness selection, surface treatment, and assembly parameter control. Problems concerning material diffusion can be categorized into fabrication-based and natural behavior, with the prior caused by the difference in assembly temperature of the substrate and wafer, causing uneven diffusion rates across the area of the wafer and substrate, and the latter due to a decrease in volume during the process when the solder material changes into intermetallic compound. Due to the fact that material diffusion is an irreversible chemical reaction, the resulting voids negatively impact the long-term reliability of the power module. Moreover, it should be noted that neither large-area joint nor micro joint prevents the void formation.

SUMMARY

One of the embodiments comprises a dual-phase intermetallic interconnection structure, comprising a first intermetallic phase, a second intermetallic phase, a first solder metal layer and a second solder metal layer. The second intermetallic phase covers the first intermetallic phase, wherein the first intermetallic phase and the second intermetallic phase contain different high melting temperature metals. The first solder metal layer and the second solder metal layer are disposed at the opposite sides of the second intermetallic phase, wherein the first intermetallic phase is used to fill the micropore defects created as a result of a decrease in volume during the formation of the second intermetallic phase.

Another of the embodiments comprises a method for fabricating a dual-phase intermetallic interconnection structure, used to form an interconnection between a die and a carrier, with the fabricating method including the following procedures. First, forming a metal stack between the die and the carrier; the metal stack comprises a first solder metal layer disposed adjacently to the die, a second solder metal layer disposed adjacently to the carrier, and a sandwich metal structure disposed between the first solder metal layer and the second solder metal layer. The sandwich metal structure is comprised of a pair of outer metal layers and an inner metal layer sandwiched between the pair of outer metal layers. Then, the metal stack is heated to melt the outer metal layers to let the metal of the outer metal layers and the metal of the inner metal layer form a first intermetallic phase, and to let the metal of the outer metal layers and the metal of the first solder metal layer and the second solder metal layer form a second intermetallic phase, wherein the second intermetallic phase covers the first intermetallic phase.

Another embodiment introduces an electronic package structure, comprising a die, a carrier, and the dual-phase intermetallic interconnection structure previously described, wherein the die and the carrier are bonded by the dual-phase intermetallic interconnection structure.

Yet another embodiment introduces an electronic package structure, comprising a first die, a second die, and the dual-phase intermetallic interconnection structure previously described, wherein the first die and the second die are bonded by the dual-phase intermetallic interconnection structure.

Yet another embodiment introduces an electronic package structure, comprising at least a large-area joint or at least a high melting temperature metal bump joint, wherein the large-area joint or the bump joint is the dual-phase intermetallic interconnection structure previously described.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Reference will now be made in detail to the present embodiments of the disclosure. It should be noted that, the terms 'high melting temperature metal' and 'low melting temperature metal' in this specification respectively mean that when the temperature is raised to a certain value, the former maintains its solid state, the latter melts, and the two can proceed to inter-diffuse as solid and liquid to form an intermetallic compound, the embodiment of which is described in detail below.

Figure 1A:
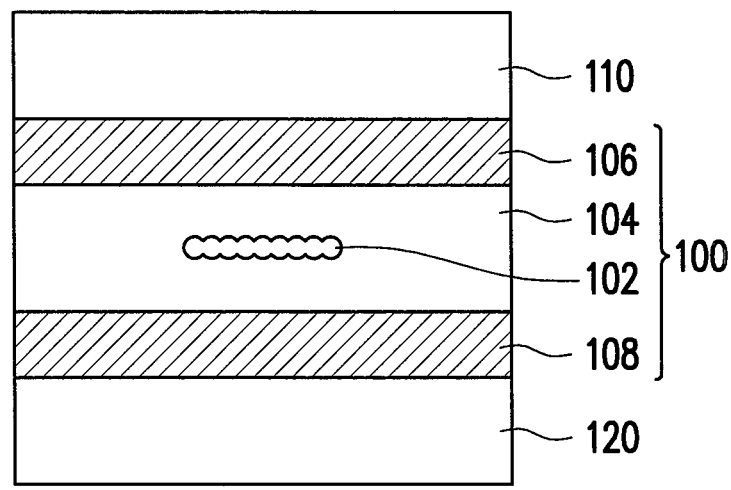
FIG. 1A and FIG. 1B are the cross-sectional schematic diagrams of the dual-phase intermetallic interconnection structure according to the first embodiment of the disclosure.
Figure 1B:
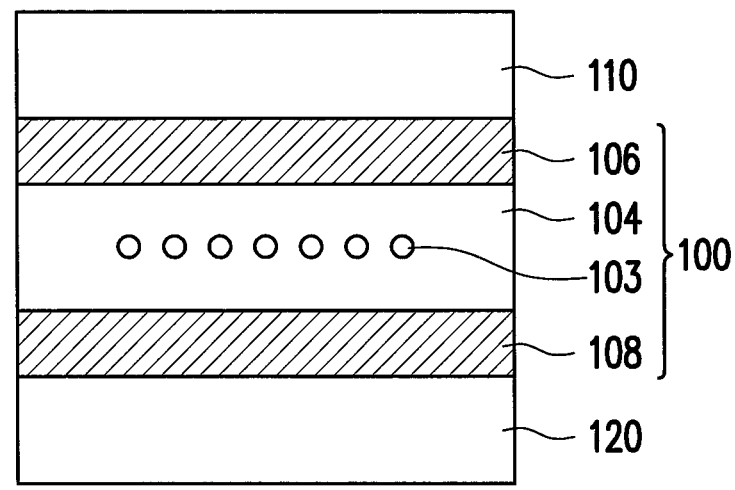

FIG. 1A and FIG. 1B are cross-sectional views of the dual-phase intermetallic interconnection structure according to the first embodiment of the disclosure.

Referring to FIG. 1A and FIG. 1B, the dual-phase intermetallic interconnection structure 100 is disposed between the die 110 and the carrier 120, and includes the first intermetallic phase 102, the second intermetallic phase 104, the first solder metal layer 106 and the second solder metal layer 108.

The die 110 may be any semiconductor die, for instance a MOSFET die or an insulated gate bipolar transistor (IGBT) die in a power module, a central processing unit (CPU) or a graphic processing unit (GPU). The carrier 120 can be any carrier suitable for bonding with the die 110, for instance a copper carrier, a silicon interposer, a lead frame or another die.

The first intermetallic phase 102 and the second intermetallic phase 104 are both intermetallic compounds formed from solid-liquid inter-diffusion of a high melting temperature metal and a low melting temperature metal, and the first intermetallic phase 102 and the second intermetallic phase 104 contain different high melting temperature metals. For instance, the first intermetallic phase 102 may include $Ag_3Sn$, and the second intermetallic phase 104 may include $Cu_6Sn_5$, that is, the high melting temperature metal contained in the first intermetallic phase 102 is silver, and the high melting temperature metal contained in the second intermetallic phase 104 is copper. However, the present embodiment is not limited to these. In other embodiments, the first intermetallic phase 102 may contain materials such as $Ni_3Sn_4$, $Cu_6Sn_5$, $Cu_{11}In_9$, $Ag_3Sn$, $Ni_{28}In_{72}$, $AuSn_4$, $AuSn_2$, $AuSn$ or $Au_5Sn$; the second intermetallic phase 104 may contain materials such as $Ni_3Sn_2$, $Cu_3Sn$, $Ag_4Sn$, $Ag_3Sn$ or $Ag_2In$, provided that the first intermetallic phase 102 and the second intermetallic phase 104 contain different high melting temperature metals. Moreover, the second intermetallic phase 104 may be made of a plurality of intermetallic compound with the same elements but different stoichiometric ratios. For instance, the second intermetallic phase 104 may contain layers of $Cu_6Sn_5$ and $Cu_3Sn$ intermetallic compounds.

In an embodiment, the first intermetallic phase 102 and the second intermetallic phase 104 may contain the same low melting temperature metal, such as tin.

As shown in FIG. 1A, the first intermetallic phase 102 is covered by the second intermetallic phase 104, and the first intermetallic phase 102 is a continuous structure. In other embodiments, the first intermetallic phase can be a non-continuous structure, in other words, the first intermetallic phase may be a plurality of aggregates separated by the second intermetallic phase 104, such as the first intermetallic phase 103 in FIG. 1B. Even in the non-continuous structure shown in FIG. 1B, the first intermetallic phase 103 is still completely covered by the second intermetallic phase 104. Moreover, the first intermetallic phase may have irregular shapes, and is not limited to the spherical aggregates as shown in FIG. 1B, and may not have the smooth surface as shown in FIG. 1A.

The first solder metal layer 106 and the second solder metal layer 108 are disposed at the opposite sides of the second intermetallic phase 104. The first solder metal layer 106 and the second solder metal layer 108 may include the same high melting temperature metal, such as nickel, copper or silver. In an embodiment, the first solder metal layer 106, the second solder metal layer 108 and the second intermetallic phase 104 contain the same high melting temperature metal.

In the embodiment, the first intermetallic phase 102 can fill or be embedded into the micro voids created during the formation of the second intermetallic phase 104, so that the dual-phase intermetallic interconnection structure 100 has a compact overall structure without the voids resulted from a decrease in volume from fabrication or natural behaviour, which improves the mechanical properties of the dual-phase intermetallic interconnection structure 100. In an embodiment where the first intermetallic phase 102 includes $Ag_3Sn$ and the second intermetallic phase 104 includes $Ni_3Sn_4$ or $Cu_6Sn_5$, the first intermetallic phase 102 has characteristics such as improving the ductility of the dual-phase intermetallic interconnection structure 100, forming a stress buffer layer (absorbing fatigue stress caused by a mismatch of coefficients of thermal expansion) and improving heat conductivity, leading to a longer lifespan.

Figure 2A:
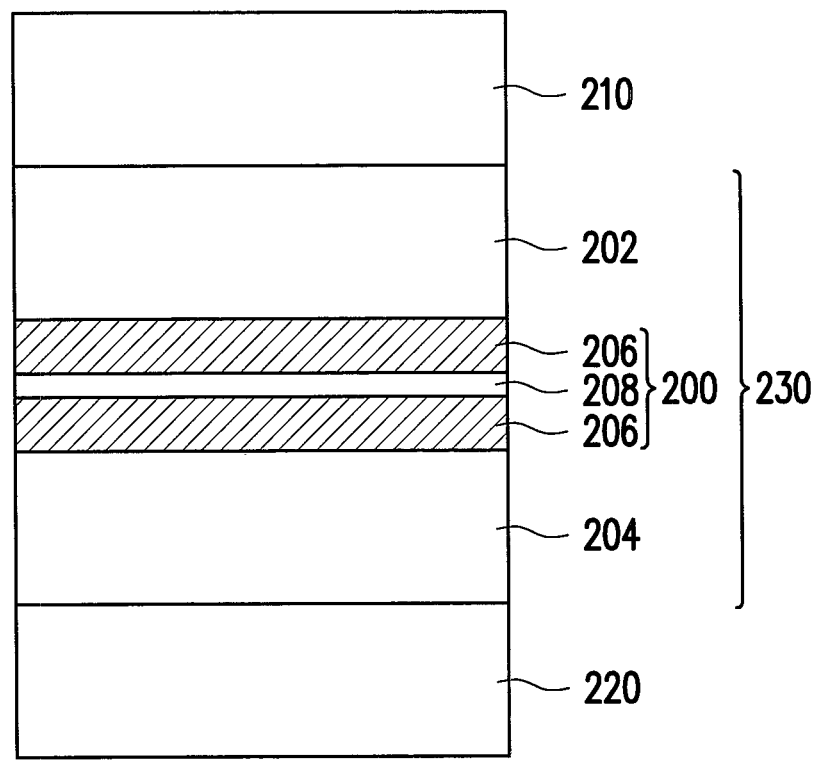
FIG. 2A to FIG. 2C are the cross-sectional flow charts of the fabrication method of the dual-phase intermetallic interconnection structure according to the second embodiment of the disclosure.
Figure 2B:
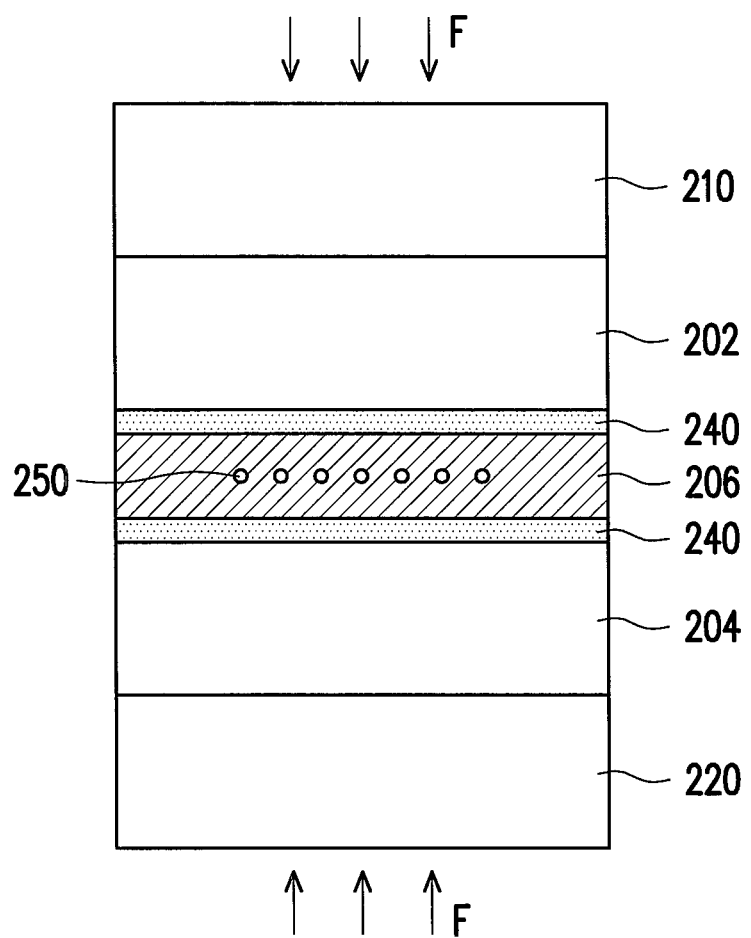
Figure 2C:
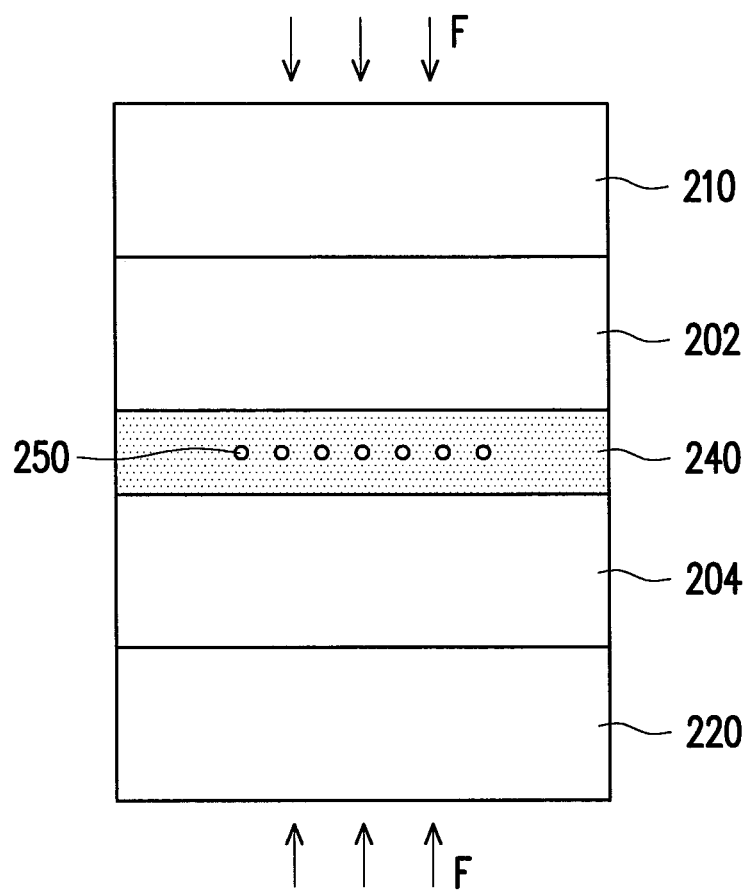

FIG. 2A to FIG. 2C are cross-sectional views of the process flow of the fabricating method of the dual-phase intermetallic interconnection structure according to the second embodiment of the disclosure.

The second embodiment of the disclosure provides a fabricating method of the dual-phase intermetallic interconnection structure, used to form an interconnection between the die 210 and the carrier 220. The examples of the die 210 and the carrier 220 may be the same as the ones described in the first embodiment.

According to the second embodiment, the fabricating method of the dual-phase intermetallic interconnection structure includes the following steps.

First, as shown in FIG. 2A, the metal stack 230 is formed between the die 210 and the carrier 220. The metal stack 230 includes the first solder metal layer 202 disposed adjacently to the die 210, the second solder metal layer 204 disposed adjacently to the carrier 220 and the sandwich metal structure 200 disposed between the first solder metal layer 202 and the second solder metal layer 204. The materials of the first solder metal layer 202 and the second solder metal layer 204 can be high melting temperature metals, and can be the same materials as the first solder metal layer 106 and the second solder metal layer 108 described in the first embodiment. In the embodiment, the first solder metal layer 202 and the second solder metal layer 204 do not peel off from the die 210 or the carrier 220. However, considering the fabricating time and the yield rate, the thickness is usually set between 3 µm to 10 µm, but the disclosure is not limited thereto.

The sandwich metal structure 200 is made of a pair of outer metal layers 206 and an inner metal layer 208 disposed between the outer metal layers 206. The material of the outer metal layers 206 can be a low melting temperature metal, such as a metal material selected from the group consisting of tin and indium. The outer metal layers 206 are used as solder material during bonding. However, considering the welding quality, the production capacity and the yield rate, the thickness is usually set between 1 µm to 5 µm, but the disclosure is not limited thereto. As for the inner metal layer 208, the material can be a high melting temperature metal, such as a metal material selected from a group consisting of gold, silver, nickel and copper; a thickness of the inner metal layer 208 can be smaller than the sum of the thicknesses of the two outer metal layers 206, and in an embodiment can be between 1 μm to 3 μm, but the disclosure is not limited thereto. During the following heating process, the low melting temperature metal of the outer metal layers 206 forms intermetallic compounds with the high melting temperature metals of the first and the second solder metal layers 202 and 204 and the high melting temperature metal of the inner metal layer 208, and therefore, the thicknesses of each layer need to be optimized based on the reaction rate, the intermetallic ratio, and the contraction ratio of the material during the formation of intermetallic compound.

The formation method of the metal stack 230 can include electroplating, printed solder paste or a combination thereof. Moreover, the sandwich metal structure 200 can form together with the first solder metal layer 202 or the second solder metal layer 204 on the die 210 or the carrier 220. Alternately, it may be to form the first solder metal layer 202, the outer metal layers 206 and the inner metal layer 208 on the die 210, to form the first solder metal layer 204 and the outer metal layer 206 on the carrier 220, and then stacking the first solder metal layer 204 and the outer metal layer 206 to form the sandwich metal structure 200. However, the disclosure is not limited to these two processes, but the structure shown in FIG. 2A has to be formed before heating the metal stack 230.

Then, as shown in FIG. 2B, the metal stack 230 is heated to melt the outer metal layers 206. The heating process can be carried out in a vacuum atmosphere, a reducing atmosphere or an atmospheric environment to conduct the sintering bonding. The heating temperature depends on the melting temperature of the material of the outer metal layers 206, and is higher than the melting temperature of the material contained in the outer metal layers 206 by 20° C. to 40° C., but the disclosure is not limited thereto. The higher the temperature, the faster the formation of the intermetallic compound occurs, but high temperature damage to the die or the carrier can be avoided. Moreover, during heating process, a pressure F can be applied to the metal stack 230. Pressure F helps to eliminate the voids at the interface of each metal layer and intermetallic layer, and also helps to fill the voids generated when intermetallic compounds form, details of which is discussed below.

In the step of FIG. 2B, the outer metal layers 206 react with the first solder metal layer 202 and the second solder metal layer 204 to form the second intermetallic phase 240. Here, it is exemplarily presumed that the first solder metal layer 202 and the second solder metal layer 204 contain the same high melting temperature metal. At the same time, the outer metal layers 206 react with the inner metal layer 208 to form the first intermetallic phase 250. In an embodiment, the thickness of the inner metal layer 208 is less than the sum of the thicknesses of the pair of outer metal layers 206; therefore at the time of FIG. 2B, the inner metal layer 208 has reacted completely, and the first intermetallic phase 250 resulted from the reaction of the inner metal layer 208 is scatteredly distributed inside the molten state outer metal layers 206. Each interface between the metal layers and the intermetallic layers in FIG. 2B is shown as a smooth interface; microscopically these interfaces may have uneven interface characteristics as a result of atomic inter-diffusion.

As shown in FIG. 2C, after the temperature has been held constant for a period, the intermetallic reaction has been completed, that is, the metal of the outer metal layers 206 reacts completely with the first solder metal layer 202 and the second solder metal layer 204, forming the second intermetallic phase 240 that covers the first intermetallic phase 250.

The second intermetallic phase 240 may include one or more intermetallic compounds. For instance, when the metal included in the first solder metal layer 202 and the second solder metal layer 204 is copper, and the metal included in the outer metal layers 206 is tin, the copper reacts with the tin, and the intermetallic compounds $Cu_6Sn_5$ and $Cu_3Sn$ are simultaneously formed, wherein $Cu_6Sn_5$ is thicker and forms first, and $Cu_3Sn$ is thinner and forms second, but the formations of these two compounds happen at almost the same time. As the temperature is held constant longer, $Cu_6Sn_5$ gradually consumes and becomes thinner and transforms into $Cu_3Sn$, but it takes a long time for $Cu_6Sn_5$ to completely transform into $Cu_3Sn$. The similar effect also happens in Ni—Sn system, CuIn system, and NiIn system, with the difference being that some intermetallic compounds that form first may not transform completely into the intermetallic compounds that form second.

During the formation of the second intermetallic phase 240, voids (not shown) may be generated as a result of a decrease in volume due to the fabrication or natural behaviour. The outer metal layers 206 are quickly consumed during the formation of the second intermetallic phase 240 at the die end and the carrier end, causing a decrease in volume and forming voids. Squeezing inward with pressure F helps to reduce the voids or retard the formation of the voids. Continuing solid-liquid inter-diffusion in a constant temperature and constant pressure condition, when the outer metal layers 206 are consumed completely, the second intermetallic phase 240 coalesce, so that the first intermetallic phase 250 can be embedded into irregular structures or voids to fill these defects. Lastly, the first intermetallic phase 250 may form a plurality of separate and individual aggregate structure covered by the second intermetallic phase 240 as shown in FIG. 2C or FIG. 1B, or may form a continuous structure as shown in FIG. 1A. Thus far, a possible mechanism that first intermetallic phase 250 fills the voids generated during solid-liquid inter-diffusion bonding is described, but the disclosure does not exclude other possible mechanisms.

In order to prove the substantial effect of embodiments of the disclosure, the following experiments are conducted.

Comparative Examples 1-3

A metal stack of 5 μm nickel layer/3 μm tin layer/5 μm nickel layer is formed between a pair of silicon substrates, and a shear stress is applied to the bonding structure with a thrust machine after a heating process to destruct the bonding structure. In the comparative examples, an intermetallic compound is formed ($Ni_3Sn_4$), and there are voids in the intermetallic compound. According to experiment results, the average stress that the bonding structures can sustain is up to about 13 MPa.

Experimental Examples 1-3

A metal stack of 5 μm nickel layer/1.5 μm tin layer/2 μm silver layer/1.5 μm tin layer/5 μm nickel layer is formed between the die and the carrier, and a shear stress is applied to the bonding structure with a thrust machine after a heating process to destruct the bonding structure. In the experimental examples, in addition to the formation of $Ni_3Sn_4$, $Ag_3Sn$ was also formed. $Ag_3Sn$ fills the voids generated from the formation of $Ni_3Sn_4$; its coefficient of thermal conductivity of 44.5 W/mK is larger than the coefficient of thermal conductivity of $Ni_3Sn_4$ (19.6 W/mK), thus reducing the heat accumulation in the bonding structure. The average stress that the bonding structures can sustain in these experimental examples increases to over 20 MPa.

Comparative Examples 4-6

A metal stack of 5 μm nickel layer/3 μm indium layer/5 μm nickel layer is formed between a pair of silicon substrate, and a shear stress is applied to the bonding structure with a thrust machine after a heating process to destruct the bonding structure. In comparative examples 4-6, an intermetallic compound is formed (nickel indium compound), and there are voids in this intermetallic compound. According to experiment results, the average stress that the bonding structures can sustain is about 6 MPa.

Experimental Examples 4-6

A metal stack of 5 μm nickel layer/3 μm indium layer/1 μm silver layer/3 μm indium layer/5 μm nickel layer is formed between a pair of silicon substrate. $Ag_2In$ is formed in the nickel indium compound after heating the metal stack. The mechanical strength is improved and the heat conductivity promoted. The average stress that the bonding structures can sustain increases to over 10 MPa.

Table 1 presents in detail the experiment results of comparative examples and experimental examples.

TABLE 1

| | the stress that the bonding structure can sustain (MPa) | | the stress that the bonding structure can sustain (MPa) |
|---|---|---|---|
| comparative example 1 | 11.73 | experimental example 1 | 19.02 |
| comparative example 2 | 14.9 | experimental example 2 | 18.86 |
| comparative example 3 | 13.65 | experimental example 3 | 25.94 |
| comparative example 4 | 6.85 | experimental example 4 | 11.06 |
| comparative example 5 | 5.76 | experimental example 5 | 11.48 |
| comparative example 6 | 5.67 | experimental example 6 | 8.2 |

The third embodiment of the disclosure provides an electronic package structure, which uses the dual-phase intermetallic interconnection structure described in the first embodiment to bond the die to the carrier. The die can be the same as the die 110 as described previously; the carrier can be the same as the carrier 120 as described previously.

The fourth embodiment of the disclosure provides an electronic package structure, and this electronic package structure includes at least a large-area joint or at least a high melting temperature metal bump joint, and the large-area joint or the bump joint is the dual-phase intermetallic interconnection structure described in the first embodiment.

Summarizing the above, the disclosure provides a dual-phase intermetallic interconnection structure, its fabricating method, and the electronic package structure that uses this dual-phase intermetallic interconnection structure. In the dual-phase intermetallic interconnection structure, the first intermetallic phase can fill or be embedded to the micro void defects generated during the formation of the second intermetallic phase, so that the dual-phase intermetallic interconnection structure does not have the voids generated from a reduction in volume, thus improving the mechanical strength of the dual-phase intermetallic interconnection structure. If the material was selected properly, then the first intermetallic phase also has characteristics such as improving the ductility of the dual-phase intermetallic interconnection structure, forming a stress buffer layer (absorbing fatigue stress caused by a mismatch of coefficients of thermal expansion) and improving heat conductivity, leading to a longer lifespan of the interconnection.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A dual-phase intermetallic interconnection structure, comprising:
    a first intermetallic phase;
    a second intermetallic phase, covering the first intermetallic phase, wherein the first intermetallic phase and the second intermetallic phase contain different high melting temperature metals; and
    a first solder metal layer and a second solder metal layer, disposed at opposing sides of the second intermetallic phase,
    wherein micro voids created as a result of a decrease in volume during formation of the second intermetallic phase is filled by the first intermetallic phase.

2. The dual-phase intermetallic interconnection structure of claim 1, wherein the first intermetallic phase is a continuous structure.

3. The dual-phase intermetallic interconnection structure of claim 1, wherein the first intermetallic phase is a non-continuous structure.

4. The dual-phase intermetallic interconnection structure of claim 1, wherein the first intermetallic phase comprises $Ni_3Sn_4$, $Cu_6Sn_5$, $Cu_{11}In_9$, $Ag_3Sn$, $Ni_{28}In_{72}$, $AuSn_4$, $AuSn_2$, AuSn or $Au_5Sn$.

5. The dual-phase intermetallic interconnection structure of claim 1, wherein the second intermetallic phase comprises $Ni_3Sn_2$, $Cu_3Sn$, $Ag_4Sn$, $Ag_3Sn$ or $Ag_2In$.

6. The dual-phase intermetallic interconnection structure of claim 1, wherein a melting temperature of the high melting temperature metals exceeds 300° C.

7. A method for fabricating a dual-phase intermetallic interconnection structure, used to form an interconnection between a die and a carrier, the method comprising:
    forming a metal stack between the die and the carrier, wherein the metal stack comprising: a first solder metal layer disposed adjacently to the die, a second solder metal layer disposed adjacently to the carrier, and a sandwich metal structure disposed between the first solder metal layer and the second solder metal layer, wherein the sandwich metal structure is comprised of a pair of outer metal layers and an inner metal layer sandwiched between the pair of outer metal layers; and
    heating the metal stack to melt the pair of outer metal layers, to let the metal of the pair of outer metal layers and the metal of the inner metal layer form a first intermetallic phase, and to let the metal of the pair of outer metal layers and the metal of the first solder metal layer and the second solder metal layer form a second intermetallic phase, wherein the second intermetallic phase covers the first intermetallic phase.

8. The method of claim 7, wherein a thickness of the inner metal layer is less than a sum of thicknesses of the pair of outer metal layers.

9. The method of claim 7, wherein during heating the metal stack, a pressure is applied to the metal stack.

10. The method of claim 7, wherein each of the first solder metal layer, the second solder metal layer and the inner metal layer is comprised of high melting temperature metal, and the pair of outer metal layers are comprised of low melting temperature metals.

11. The method of claim 10, wherein the first solder metal layer and the second solder metal layer respectively comprises a same material of one of the high melting temperature metals, and the inner metal layer and the first solder metal layer respectively comprises different materials of the high melting temperature metals.

12. The method of claim 10, wherein a material of the pair of outer metal layers is a metal material selected from a group consisting of tin and indium.

13. The method of claim 11, wherein a material of the first solder metal layer and the second solder metal layer is a metal material selected from a group consisting of silver, nickel or copper.

14. The method of claim 11, wherein a material of the inner metal layer is a metal material selected from a group consisting of gold, silver, nickel or copper.

15. An electronic package structure, comprising a die, a carrier, and the dual-phase intermetallic interconnection structure of claim 1, wherein the die and the carrier are bonded by the dual-phase intermetallic interconnection structure.

16. An electronic package structure, comprising a first die, a second die, and the dual-phase intermetallic interconnection structure of claim 1, wherein the first die and the second die are bonded by the dual-phase intermetallic interconnection structure.

17. An electronic package structure, comprising at least a large-area joint or at least a bump joint, wherein the large-area joint or the bump joint is the dual-phase intermetallic interconnection structure of claim 1.

* * * * *